United States Patent
Choi et al.

(10) Patent No.: US 7,470,612 B2
(45) Date of Patent: Dec. 30, 2008

(54) METHOD OF FORMING METAL WIRING LAYER OF SEMICONDUCTOR DEVICE

(75) Inventors: Kyung-in Choi, Chuncheon-si (KR); Sung-ho Han, Seoul (KR); Sang-woo Lee, Seoul (KR); Dae-yong Kim, Yongin-si (KR)

(73) Assignee: Samsung Electronics Co, Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 11/519,844

(22) Filed: Sep. 13, 2006

(65) Prior Publication Data

US 2007/0059925 A1    Mar. 15, 2007

(30) Foreign Application Priority Data

Sep. 13, 2005  (KR) ............ 10-2005-0085290
Jan. 6, 2006   (KR) ............ 10-2006-0001691

(51) Int. Cl.
*H01L 21/4763* (2006.01)

(52) U.S. Cl. .............. 438/627; 438/633; 438/638; 438/672; 438/675; 438/791; 257/E21.579; 257/E21.649; 257/E21.627; 257/E21.641

(58) Field of Classification Search ........... 438/633, 438/634, 638, 791, FOR. 355, FOR. 489, 438/627, 672, 675; 257/E21.579, E21.649, 257/E21.627, E21.641
See application file for complete search history.

(56) References Cited

U.S. PATENT DOCUMENTS

| | | | | |
|---|---|---|---|---|
| 6,376,353 B1 * | 4/2002 | Zhou et al. | .......... | 438/612 |
| 6,417,094 B1 * | 7/2002 | Zhao et al. | .......... | 438/627 |
| 6,537,913 B2 * | 3/2003 | Modak | .......... | 438/687 |
| 6,939,793 B1 * | 9/2005 | You et al. | .......... | 438/624 |
| 6,972,253 B2 * | 12/2005 | Liu et al. | .......... | 438/627 |
| 2006/0172527 A1 * | 8/2006 | Marxsen et al. | .......... | 438/633 |
| 2006/0205204 A1 * | 9/2006 | Beck | .......... | 438/628 |
| 2007/0013069 A1 * | 1/2007 | Tada et al. | .......... | 257/758 |

FOREIGN PATENT DOCUMENTS

| | | |
|---|---|---|
| JP | 2001-110769 | 4/2001 |
| KR | 1020010109474 A | 12/2001 |
| KR | 1020040000702 A | 1/2004 |
| KR | 1020050045767 A | 5/2005 |

* cited by examiner

*Primary Examiner*—Michelle Estrada
(74) *Attorney, Agent, or Firm*—Volentine & Whitt, PLLC

(57) ABSTRACT

A method of forming a metal wiring layer of a semiconductor device produces metal wiring that is free of defects. The method includes forming an insulating layer pattern defining a recess on a substrate, forming a conformal first barrier metal layer on the insulating layer pattern, and forming a second barrier metal layer on the first barrier metal layer in such a way that the second barrier metal layer will facilitate the growing of metal from the bottom of the recess such that the metal can fill a bottom part of the recess completely and thus, form damascene wiring. An etch stop layer pattern is formed after the damascene wiring is formed so as to fill the portion of the recess which is not occupied by the damascene wiring.

14 Claims, 9 Drawing Sheets

METHOD OF FORMING METAL WIRING LAYER OF SEMICONDUCTOR DEVICE

BACKGROUND OF THE INVENTION

1. Field of the Invention

The present invention relates to a method of forming a metal wiring layer of a semiconductor device.

2. Description of the Related Art

The line widths of wiring patterns of semiconductor devices are being made smaller and smaller to increase the degree of integration of the devices. The wiring patterns are constituted by a series of metallic lines. Conventionally, metal wiring patterns were formed by depositing metal on an insulting layer and then patterning the resultant metal layer. However, patterning a metal layer to produce a pattern of very narrow lines is difficult. An example of an alternative method capable of forming a pattern of metal lines having a very small line width is a damascene process.

The damascene process basically entails forming recesses, e.g., trenches, in an insulating layer and then filling the recesses with metal such as Al. In general, such a damascene process comprises forming an Al layer serving as a seed layer in the recesses by chemical vapor deposition (CVD) process, depositing Al thereon by physical vapor deposition (PVD), and then conducting a high temperature treatment of the resultant structure to grow the Al crystals and thereby form Al wiring in the recesses. The critical dimension (CD), namely the line width, of the wiring formed by a damascene process can be 100 nm or less.

However, a pinch off phenomenon may occur when wiring having such a minute line width is formed using a damascene process. More specifically, the pinch off phenomenon is one in which an inlet of a recess in the insulating layer is closed by Al during the CVD process, i.e., before the PVD process is carried out. In this case, a void is formed in the recessed region. Therefore, the resistance of the wiring is relatively high. Accordingly, the semiconductor device may not operate stably, and the wiring of the semiconductor device may even experience a short circuit during use.

In addition, an IMD (InterMetallic Dielectric) layer is formed on an upper portion of the damascene wiring. Then contact or via holes are formed in the IMD layer. The contact or via holes extend to and expose the damascene wiring so that the wiring may be connected to an upper metallic layer. Basically, the contact or via holes are formed by etching the IMD layer. However, the Al wiring may be etched when the IMD layer is etched because there is almost no etch selectivity between the oxide of the IMD layer and the Al of the wiring layer. That is, the damascene wiring may be damaged during the etching of the IMD layer. In particular, short circuits are likely to occur in a thin damascene wiring that has been etched during the forming of the contact or via holes. Accordingly, it is difficult to manufacture a reliable semiconductor device whose wiring has a minute line width.

SUMMARY OF THE INVENTION

An object of the invention is to provide a method of forming a reliable metal wiring layer of a semiconductor device.

According to an aspect of the invention, a method of forming a metal wiring layer of a semiconductor device includes forming an insulating layer pattern defining a recess on a substrate, forming a conformal first barrier metal layer on the insulating layer pattern, and forming a second barrier metal layer on the first barrier metal layer in such a way that the second barrier metal layer will facilitate the growing of metal from the bottom of the recess such that the metal can fill a bottom part of the recess completely and thereby form damascene wiring of the wiring layer.

According to another aspect of the invention, the second barrier metal layer comprises a nitride layer, and the process of forming the second barrier metal layer is terminated at a time when the nitrogen content of that portion of the second barrier metal layer extending within the recess is lower than the nitrogen content of that portion of the second barrier metal layer which lies over the upper surface of the insulating layer pattern.

According to still another aspect of the invention, the process of forming the second metal barrier layer is terminated when the second barrier metal layer extends over only a portion of the first barrier metal layer disposed within the recess. Therefore, part of the first barrier metal layer is left exposed after the second barrier metal layer has been formed.

According to still yet another aspect of the invention, the second metal barrier layer is formed by a PVD process that is terminated at a point in time at which the thickness of the second barrier metal layer varies and, in particular, decreases at least in part, in the depth-wise direction of the recess.

BRIEF DESCRIPTION OF THE DRAWINGS

The above and other objects, features and advantages of the invention will become more apparent from the following detailed description of the preferred embodiments thereof made with reference to the attached drawings in which.

DETAILED DESCRIPTION OF THE PREFERRED EMBODIMENTS

Figure 1:
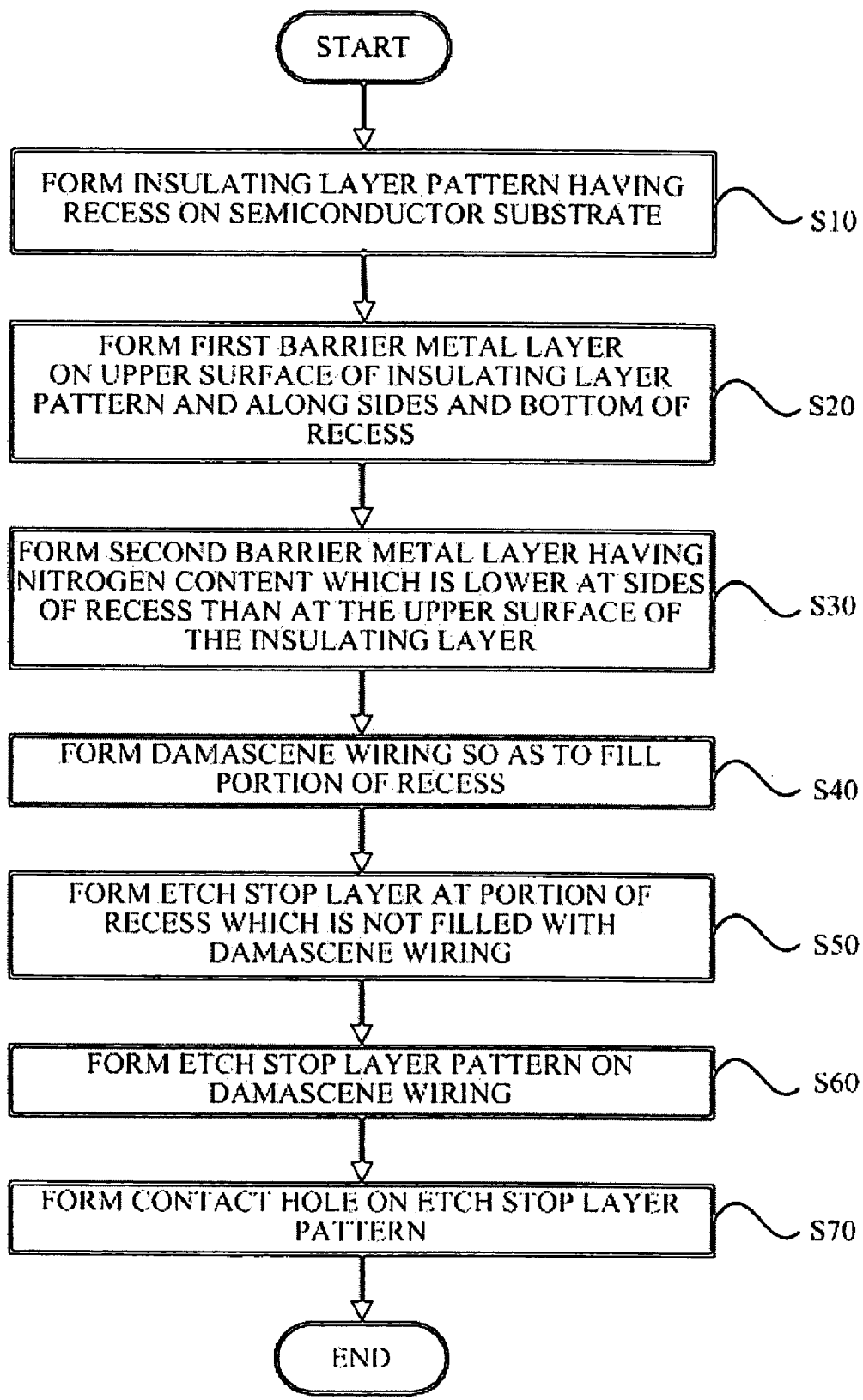
FIG. 1 is a flow chart of a first example of a method of forming a metal wiring layer of a semiconductor device according to the invention.

A method of forming a metal wiring layer of a semiconductor device according to the present invention will now be described with reference to the drawings. Note, like reference numerals denote like elements throughout the drawings.

Figure 2:
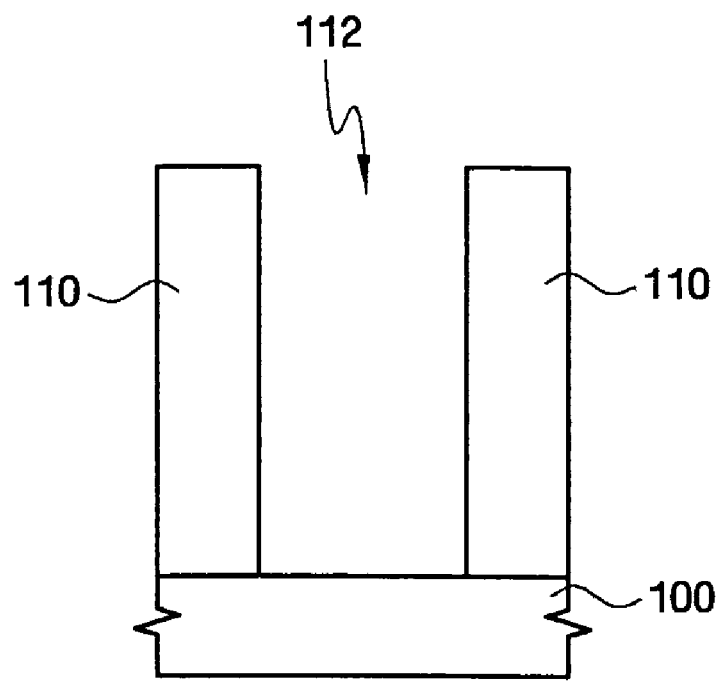
FIGS. 2 to 9 are respective cross-sectional views of a substrate, and together illustrate a sequence of manufacture in the first example of the method of forming a metal wiring layer of a semiconductor device according to the invention.

Referring first to FIGS. 1 and 2, an insulating layer pattern 10 defining a recess 112 is formed on a semiconductor substrate 100 (S10). To this end, first, an insulating layer is formed on the semiconductor substrate 100. For example, the insulating layer may be a silicon oxide layer, a silicon nitride layer, or a low-K insulating layer. Also, the insulating layer may consist of a single film of material or may be a lamination. Next, the insulating layer is patterned by, for example, photolithographic and etching processes as is conventional, per se. At this time, the depth of the recess 112 is greater than the thickness of the damascene wiring to be formed. For example, the depth of the recess 112 may be about 2500 Å when a metal wiring layer having a thickness of 2000 Å is to be formed.

Figure 3:
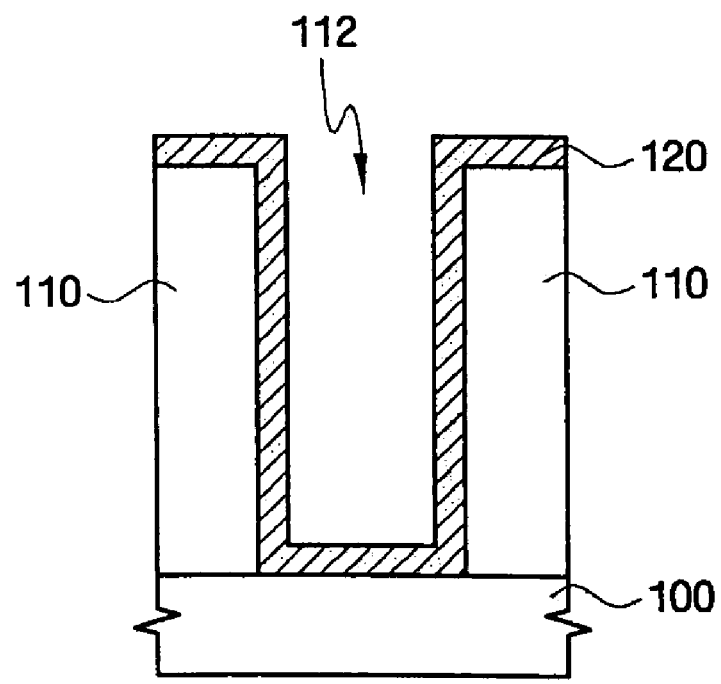

Referring to FIGS. 1 and 3, a first barrier metal layer 120 is formed on the upper surface of the insulating layer pattern 110, and along surfaces of the insulating layer pattern 110 that define the sides and bottom of the recess 112 (S20). The first barrier metal layer 120 may be formed of Ti, TiN, WN, W, Ta, TaN, Ru, Cu or a combination thereof. In addition, the first barrier metal layer 120 may be formed using PVD, CVD or ALD (Atomic Layer Deposition). For example, in the case in which the first barrier metal layer 120 is a lamination of a Ti film and a TiN film, the Ti film may be formed by a CVD process which uses TiCl4 as process gas, and the TiN film may be formed by a thermal CVD process which uses TiCl4 and NH3 as process gas.

Figure 4:
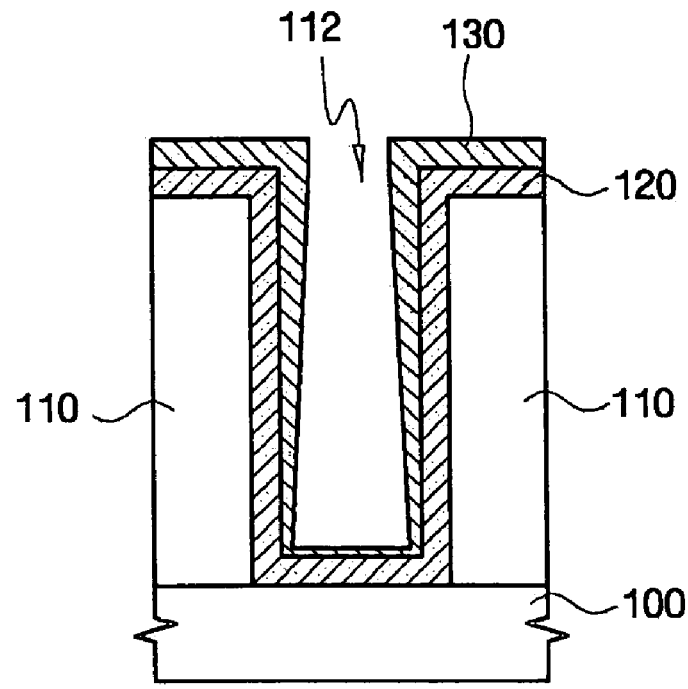

Referring to FIGS. 1 and 4, a second barrier metal layer 130 having nitrogen as part of its composition, i.e., a nitride layer, is formed over the first barrier metal layer 120. The nitrogen content of that portion of the second barrier metal layer 130 disposed over the walls defining the recess 112 is lower than the nitrogen content of that portion of the second barrier metal layer 130 disposed over the upper surface of the insulating layer pattern 110 (S30). The second barrier metal layer 130 may be a TiN layer. The second barrier metal layer 130 may also be formed by a PVD process such as a high density magnetron sputtering process using an HCM (Hollow Cathode Magnetron). In this case, a wafer is mounted on a support in a PVD chamber, and Ti is sputtered onto the wafer from a hollow cathode Ti target. Also, Ar and a gas comprising nitrogen, such as N2, are supplied into the PVD chamber. At this time, the temperature in the PVD chamber may be maintained at about 25 to 400° C., and about 2 to 40 kW power may be applied to the hollow cathode Ti target.

The second barrier metal layer 130 may be formed in a metallic mode of operation of the PVD apparatus. That is, the volume of the Ar supplied into the PVD chamber is regulated to be greater than that of the N2 as the second barrier metal layer 130 is being formed. Preferably, the volume of the Ar supplied into the PVD chamber is four times that of the N2.

The thickness of the portion of the second barrier metal layer 130 disposed on the upper surface of the insulating layer pattern 110 is greater than the thickness of the other portions of the second barrier metal layer 130. That is, the second barrier metal layer 130 is the thickest above the upper surface of the insulating layer pattern 110, and the thickness of the second barrier metal layer 130 decreases towards the bottom of the recess 112. That is, a second barrier metal layer 130 is formed by a PVD process characterized in that the material from which the second barrier metal layer 130 is formed is deposited at a rate that decreases as the distance from the target increases, whereby the thickness of the second barrier metal layer 130 varies according to the depth of the recess 112. The duration of the PVD process is controlled such that the second metal barrier layer 130 never becomes fully developed as in the prior art and thus, has the profile described above and illustrated in FIG. 4.

Figure 5:
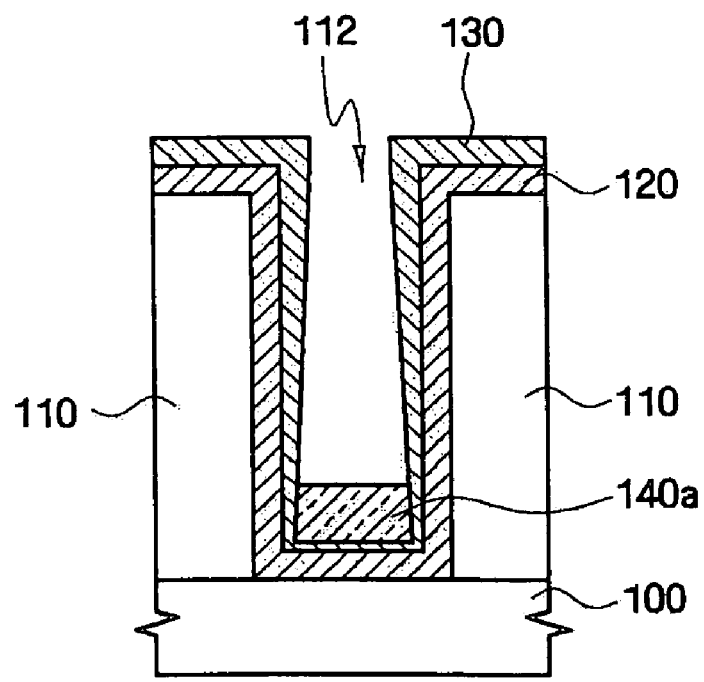
Figure 6:
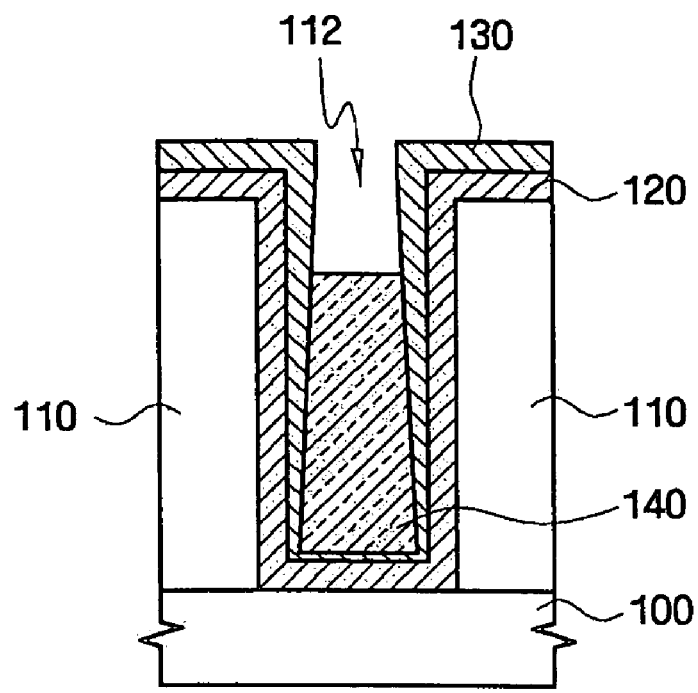

Next, referring to FIGS. 1, 5 and 6, damascene wiring 140 is formed so as to fill a portion of the recess 112 (S40). The damascene wiring 140 may be formed of Al. The damascene wiring 140 is formed in-situ by transferring the substrate 100 on which the second barrier metal layer 130 has been formed to a CVD chamber while a vacuum pressure is maintained. In this case, the damascene wiring 140 may be formed by a MOCVD (Metal Organic CVD) process.

In the forming of the damascene wiring 140, process conditions such as the deposition time, deposition temperature, deposition pressure, and flow rate of carrier gases may be controlled so as to inhibit a reaction of the Al outside the recess 112. More specifically, the deposition temperature is kept as low as possible to minimize the rate at which the Al is deposited outside the recess 112. For example, the deposition temperature may be set at 100 to 200° C. In addition, the deposition pressure may be set as high as possible so that a large amount of the Al source gas reaches the inside of the recess 112 within as short a time as possible. The Al source gas may comprise MPA (MethylPyrrolidineAlane), DMEAA (DiMethylEthylAmine Alane), DMAH (DiMethylAluminuim Hydride), TMAA (TriMethylAmine Alane), TMA, or aluminum boron hydride trimethylamine. Also, the deposition pressure may be set at 0.1 to 50 Torr. Furthermore, when Ar is used as the carrier gas, the Ar may be supplied at a flow rate of, for example, about 50 to 5000 sccm, and preferably at a flow rate of about 100 to 1000 sccm.

In addition, the nitrogen content of the second barrier metal layer 130 influences the growth of Al. More specifically, the growth of the Al layer is inhibited at the upper surface of the insulating layer pattern 110 where the nitrogen content of the second barrier metal layer 130 is high. Meanwhile, the Al layer grows at a higher rate at the lower portion of the recess 112 where the second barrier metal layer 130 is relatively thin and the nitrogen content of the second barrier metal layer 130 is relatively low, because a number of nuclear sites, i.e., sites that facilitate the forming of the Al layer, are present at the bottom of the recess 112. That is, the Al layer grows best at the bottom of the recess 112 where the second barrier metal layer 130 is thinnest and the nitrogen content thereof is lowest. Accordingly, the Al basically grows from the bottom of the recess 112 towards the upper portion thereof. Subsequently, the substrate 100 is subjected to an annealing process, i.e., is heat treated. The heat treatment improves the durability of the damascene wiring 140.

Figure 7:
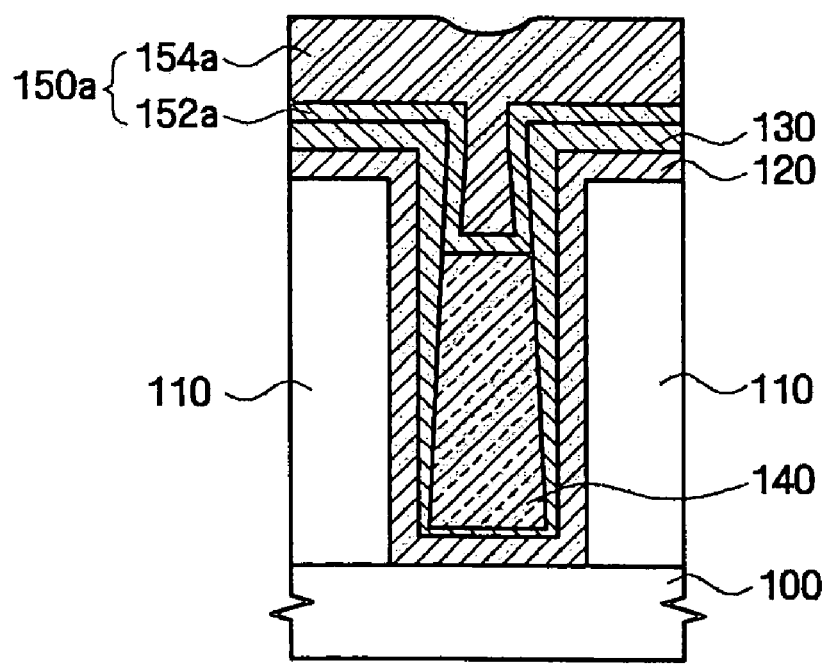

Next, referring to FIGS. 1 and 7, an etch stop layer 150a is formed in the recess 112 which is partially filled by the damascene wiring 140 (S50). At this time, the etch stop layer 150a may also be formed over the upper surface of the insulating layer pattern 110. The etch stop layer 150a may be formed of materials which offer a lower contact resistance than the damascene wiring 140 alone. For example, the etch stop layer 150a may be formed of Ti, TiN, WN, W, Ta, TaN, Ru, Cu, CoWP or a combination thereof, and may be formed of materials which improve the EM (Electro Migration) characteristic by reacting with the Al of the damascene wiring 140. The etch stop layer 150a includes a first etch stop film 152a and a second etch stop film 154a. The first etch stop film 152a may be formed of Ti, and the second etch stop film 154a may be formed of TiN. The etch stop layer 150a may be formed by PVD, CVD, or ALD. In addition, the annealing of the substrate 100 may be performed after the etch stop layer 150a is formed.

Figure 8:
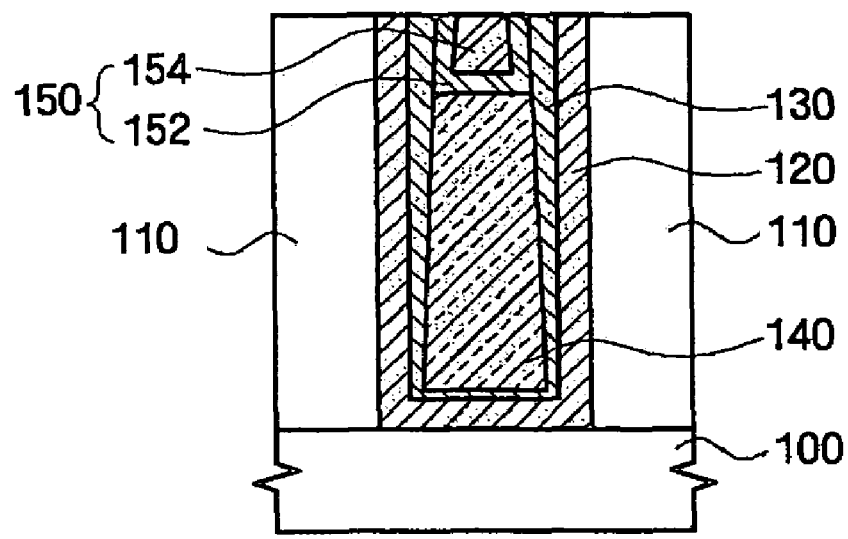

Next, referring to FIGS. 1 and 8, an etch stop layer pattern 150 is formed on the damascene wiring 140 (S60). More specifically, the etch stop layer pattern 150 is formed by removing select portions of the second etch stop film 154a, the first etch stop film 152a, the second barrier metal layer 130, and the first barrier metal layer 120 to expose the upper surface of the insulating layer pattern 110. In this respect, the portions of the second etch stop film 154a, the first etch stop film 152a, the second barrier metal layer 130, and the first barrier metal layer 120 located on the upper surface of the insulating layer pattern 110 may be removed by a CMP (Chemical Mechanical Polishing) process or an etch back process to form the etch stop layer pattern 150.

Figure 9:
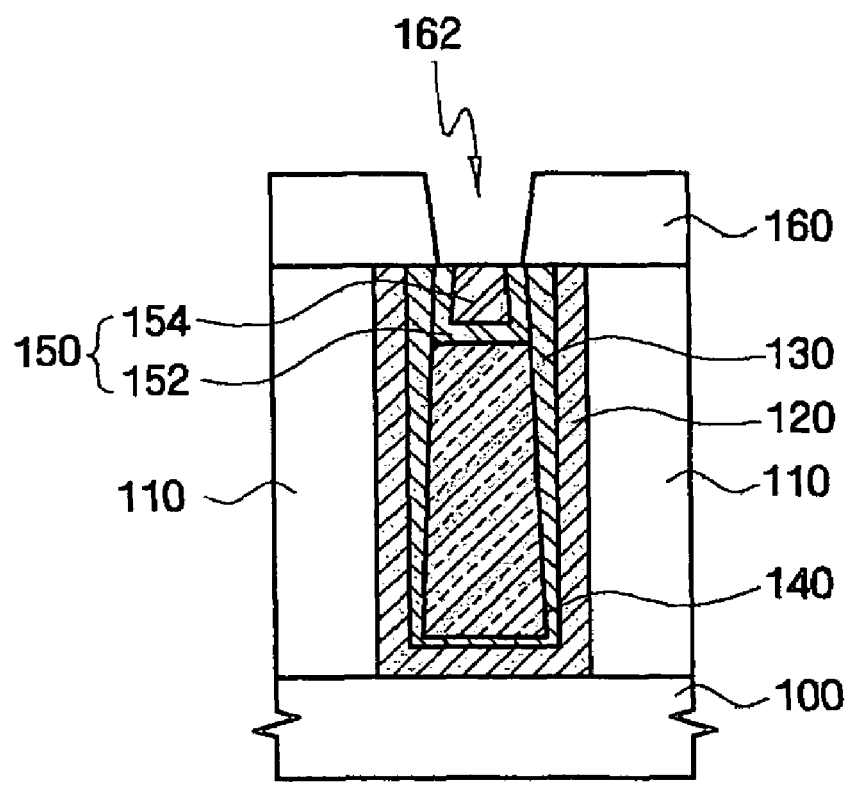

Next, referring to FIGS. 1 and 9, a contact hole 162 is formed over the etch stop layer pattern 150 (S70). To this end, first, an IMD (Inter Metallic Dielectric) layer 160 is formed on the on the insulating layer pattern 110 and etch stop layer pattern 150. Then, a photoresist pattern serving as an etch mask is formed on the IMD layer 160. Then the IMD layer 160 is etched. The contact hole 162 serves to allow the damascene wiring 140 to be connected to a metal layer formed on the IMD layer (160).

The damascene wiring 140 inside the recess 112 is not exposed to the etchant used to form the contact hole 162 in the IMD layer 160 because the etch stop layer pattern 150 is disposed on the damascene wiring 140 during the etching of the IMD layer. Accordingly, the damascene wiring 140 is not damaged when the contact hole 162 is formed.

Figure 16:
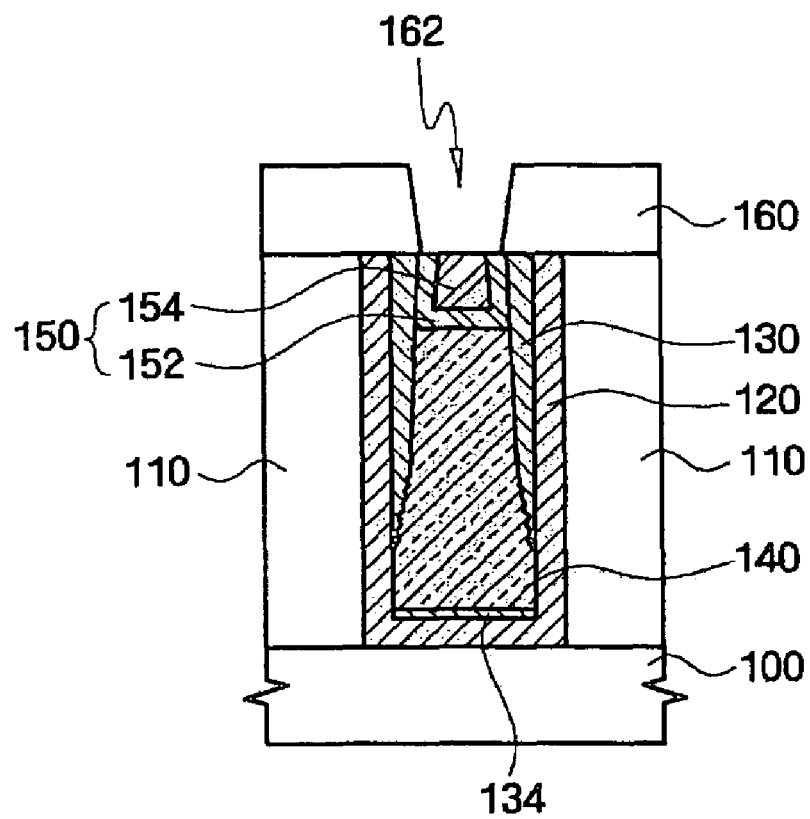

Another example of the method of forming a metal wiring layer of a semiconductor device will be described with reference to FIGS. 10 and 16.

This example of the method of forming a metal wiring layer of a semiconductor device differs from the above-described first example in that the second barrier metal layer is formed in only a portion of the recess 112.

Figure 10:
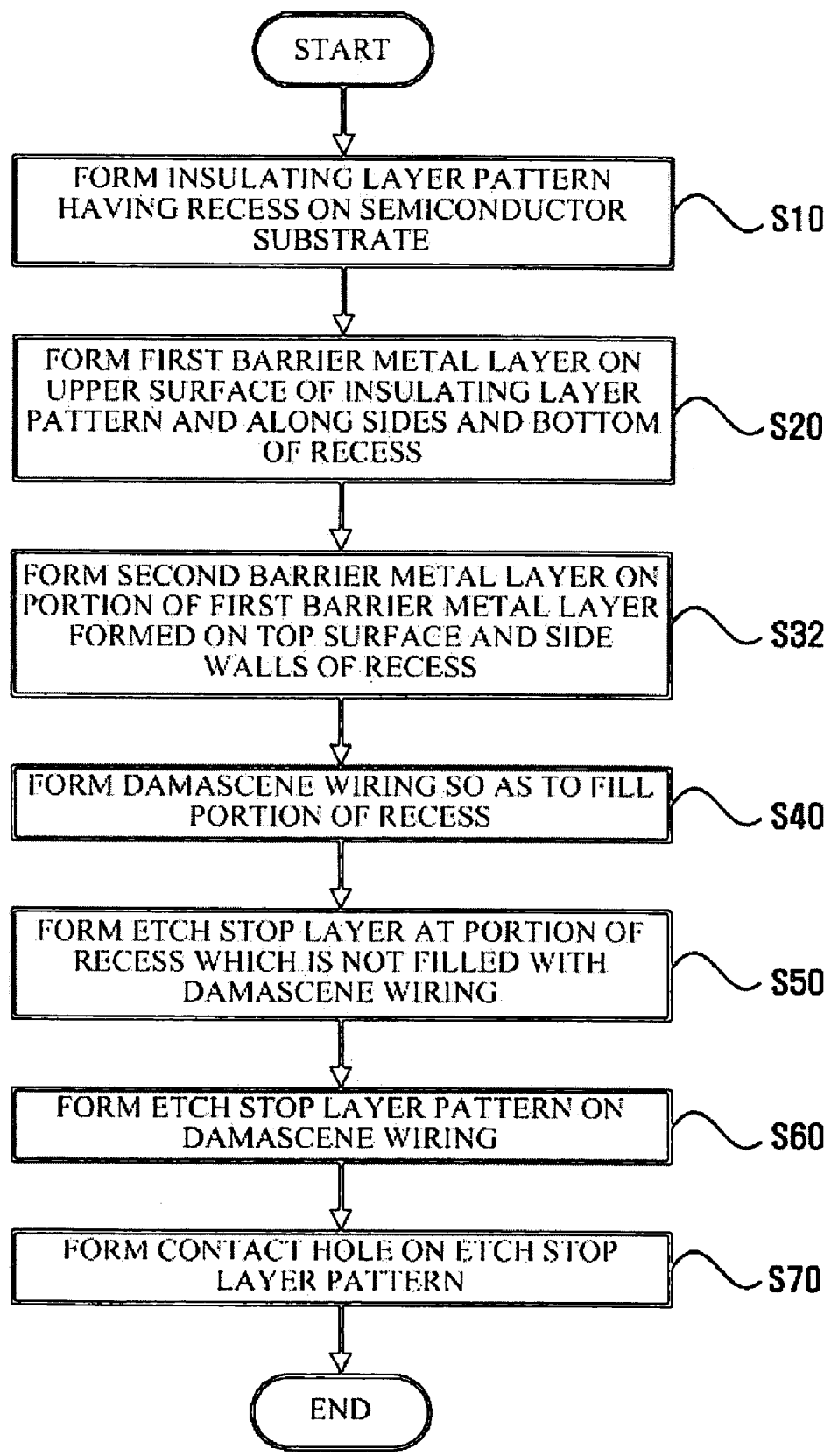
FIG. 10 is a flow chart of another example of the method of forming a metal wiring layer of a semiconductor device according to the invention.
Figure 11:
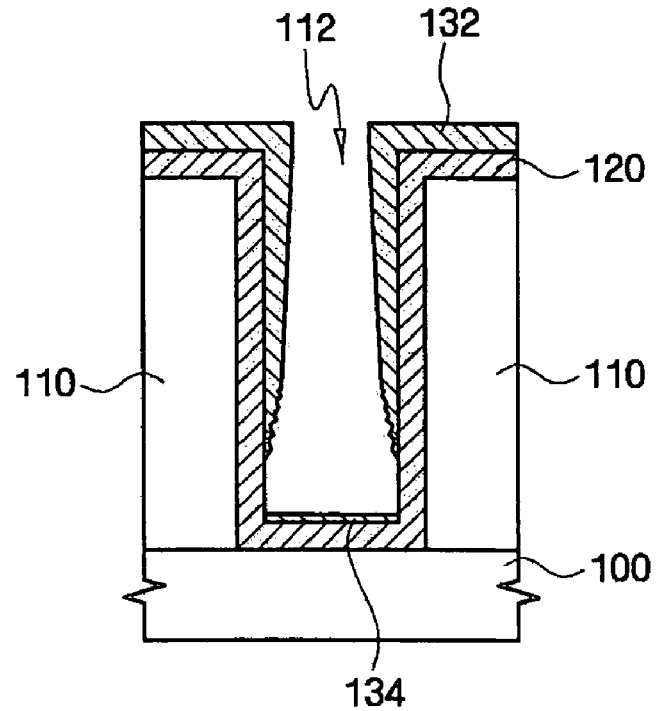
FIGS. 11 to 16 are respective cross-sectional views of a substrate, and together illustrate a sequence of manufacture in the second example of the method of forming a metal wiring layer of a semiconductor device according to the invention.

Referring first to FIGS. 10 and 11, steps S10 and S20 are similar to those of the first embodiment of the invention and thus, a detailed description thereof will be omitted. Next, a second barrier metal layer is formed on only a portion of the first barrier metal layer 120 (S32). More specifically, the second barrier metal layer has a first section 132 formed on the upper surface of the insulating layer pattern 110, and on a sidewall of the insulating layer pattern 110 that defines the sides of the recess 112. The portion of the first section 132 disposed along the sides of the recess 112 gradually becomes thinner towards the bottom of the recess 112. The second barrier metal layer also has a second section 134 formed at the bottom of the recess 112 as spaced from the first section 132. The first and second sections 132 and 134 of the second barrier metal layer are formed simultaneously by a PVD process such as the high density magnetron sputtering process using an HCM. That is, the sections 132, 134 of the second barrier metal layer are formed by a PVD process characterized in that the material from which the second barrier metal layer is formed is deposited at a rate that decreases as the distance from the target increases. In this example, the material is not deposited on a lower portion of the sides of the recess 112. In this example, the duration of the PVD process is controlled to be even shorter than that of the example described above in connection with FIGS. 1-9 such that the second metal barrier layer becomes even less developed and thus, has the profile illustrated in FIG. 11. That is, unlike the first example, a discontinuity is formed in the second metal barrier layer and yet, like the first example, the thickness of the second barrier metal layer varies according to the depth of the recess 112. Also, the ratio of N to Ti of the second barrier metal layer is smaller than that of the first barrier metal layer 120.

Figure 12:
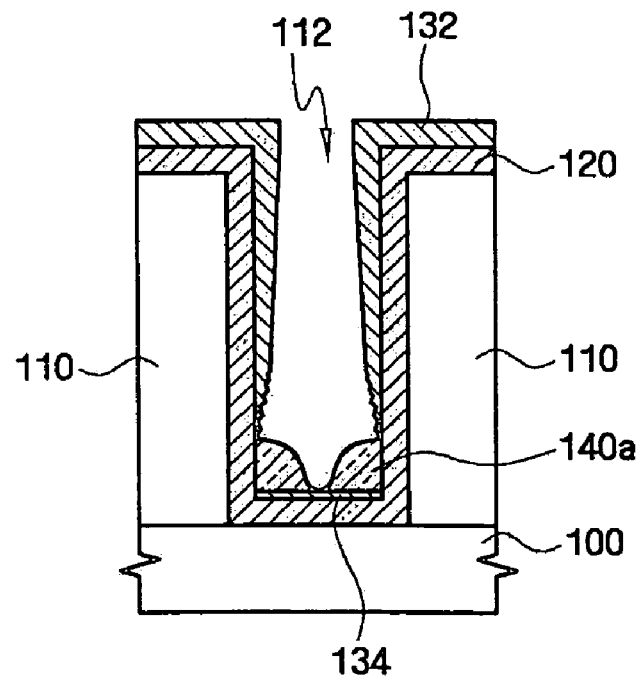
Figure 13:
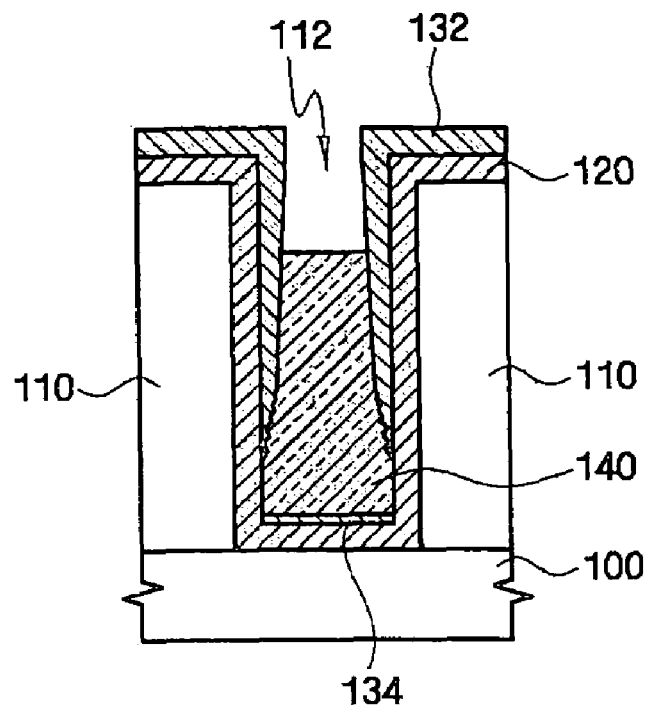
Figure 14:
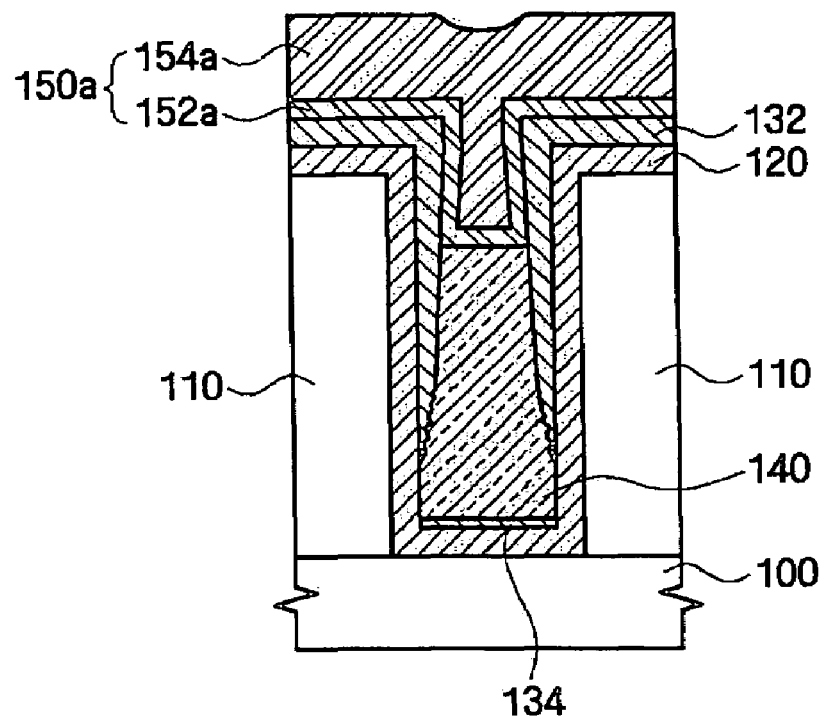
Figure 15:
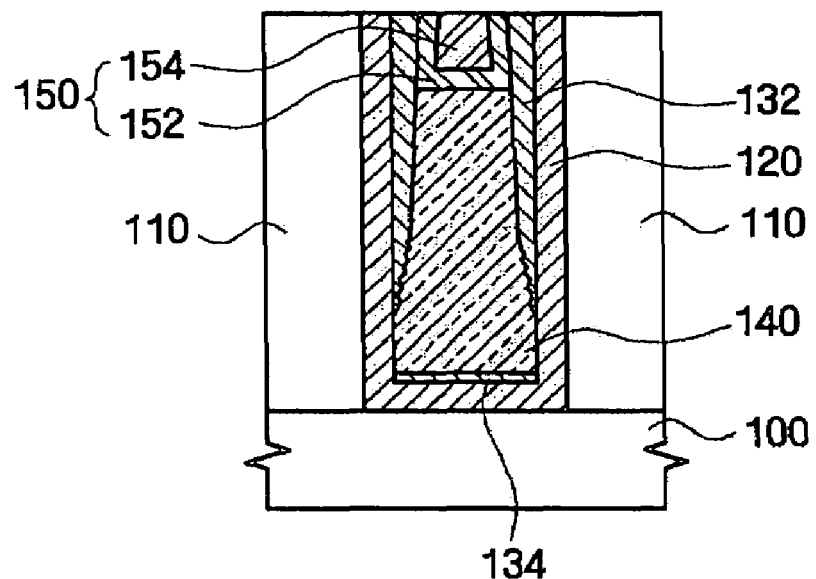

Next, referring FIGS. 10, 12 and 13, the damascene wiring 140 is formed so as to fill a portion of the recess 112 (S40). At this time, the growth of Al serving as the damascene wiring 140 starts at the lower portion of the sides of the recess 112 where the first barrier metal layer 120 is exposed. In this respect, Al of the second barrier metal layer formed by the PVD process grows slower than the Al of the first barrier metal layer 120 formed by the CVD process as the ratio of N to Ti of the second barrier metal layer is smaller than that of the first barrier metal layer. Therefore, even though sections 132 and 134 of the second barrier metal layer are formed on the first barrier metal layer 120, the growth of Al starts first at the discontinuity of the second barrier metal layer (between the sections 132 and 134) in the recess 112.

Next, referring to FIGS. 10 and 14 to 16, an etch stop layer 150a is formed on the damascene wiring 140 (S50). Then, the etch stop layer 150a is patterned to form an etch stop layer pattern 150 (S60). Subsequently, a contact hole 162 is formed on the metal wiring layer as aligned with the recess 112 (S70). These steps are carried out in a manner similar to those described above in connection with the first example of the method of forming a wiring layer according to the invention. Thus a detailed description of these steps will be omitted.

In summary as to the method of forming a metal wiring layer of a semiconductor device according to the present invention, Al is grown from the bottom of the recess 112 by a CVD process. Accordingly, the resulting damascene wiring 140 fills only a portion of the recess 112. Also, a layer of Al is not formed on the upper surface of the insulating layer pattern 110. Moreover, the Al forming the damascene wiring 140 fills the lower portion of the recess 112 uniformly so that a void is not formed in the recess 112. Hence, a reliable metal wiring layer, i.e., a metal wiring layer that is not prone to short circuiting, is formed.

In addition, the etch stop layer pattern 150 prevents the damascene wiring 140 from being damaged when a contact hole is formed on the metal wiring layer. More specifically, the Al layer is vulnerable because there is almost no etch selectivity between the oxide of the IMD layer 160 and the Al of the damascene wiring 140. However, the etch stop layer pattern 150 stops the etching process and thus, the etchant never reaches the damascene wiring 140.

Still further, the contact resistance between etch stop layer pattern 150 and the damascene wiring 140 is small. Thus, the etch stop layer pattern 150 does not degrade the electrical characteristics of the wiring layer.

For all of these reasons, the present invention allows reliable semiconductor devices to be manufactured.

Finally, although the present invention has been described above in connection with the preferred embodiments thereof, it is to be understood that the scope of the invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A method of forming a metal wiring layer of a semiconductor device, the method comprising:

forming an insulating layer pattern defining a recess on a substrate;

forming a first barrier metal layer which extends over an upper surface of the insulating layer pattern, over a side wall of the insulating layer pattern that defines the sides of the recess, and along the bottom of the recess;

forming a second barrier metal layer on the first barrier metal layer comprising including over that portion of the first barrier metal layer that overlies the upper surface of the insulating layer pattern and over that portion of the first barrier metal layer that extends within the recess, the second barrier metal layer comprising a nitride layer, and wherein the forming of the second barrier metal layer is terminated at a time when the nitrogen content of that portion of the second barrier metal layer extending within the recess is lower than the nitrogen content of that portion of the second barrier metal layer which lies over the upper surface of the insulating layer pattern;

filling only a portion of the recess with electrically conductive material to thereby form a damascene wiring; and forming an etch stop layer pattern in an upper portion of the recess which is not occupied by the damascene wiring.

2. The method of claim 1, wherein said forming of the second barrier metal layer comprises forming a second barrier metal layer that becomes thinner in a direction from the upper surface of the insulating layer towards the bottom of the recess.

3. The method of claim 1, wherein the second barrier metal layer is formed by a PVD process.

4. The method of claim 1, wherein the forming of the damascene wiring comprises growing Al from the bottom of the recess.

5. The method of claim 1, wherein the forming of the etch stop layer pattern comprises forming a first etch stop film and subsequently forming a second etch stop film on the first etch stop film.

6. The method of claim 5, wherein the forming of the etch stop layer pattern comprises:

forming the first etch stop film and the second etch stop film to each extend over the upper surface of the insulating layer pattern as well as in the portion of the recess which is not occupied with the damascene wiring, and subsequently selectively removing respective portions of the second etch stop film, the first etch stop film, the second barrier metal layer, and the first barrier metal layer to expose the upper surface of the insulating layer pattern.

7. The method of claim 1, further comprising forming a contact hole aligned with the recess, after the etch stop layer pattern has been formed.

8. A method of forming a metal wiring layer of a semiconductor device, the method comprising:

forming an insulating layer pattern defining a recess on a substrate;

forming a first conformal barrier metal layer over the insulating layer pattern such that respective portions of the first conformal barrier metal layer extend over an upper surface of the insulating layer pattern, over the entire side wall of the insulating layer pattern that defines the sides of the recess, and over the entire bottom of the recess;

forming a second barrier metal layer over that portion of the conformal first barrier metal layer that overlies the upper surface of the insulating layer pattern and along the first barrier metal layer within the recess including over the portion of the first conformal barrier metal layer that extends over the bottom of the recess, the second barrier metal layer comprising a nitride layer, and wherein the forming of the second barrier metal layer is terminated at a time when the nitrogen content of that portion of the second barrier metal layer within the recess is lower than the nitrogen content of that portion of the second barrier metal layer which lies over the upper surface of the insulating layer pattern;

filling only a portion of the recess with electrically conductive material to thereby form a damascene wiring; and forming an etch stop layer pattern in an upper portion of the recess which is not occupied by the damascene wiring.

9. The method of claim 8, wherein said forming of the second barrier metal layer comprises forming a second barrier metal layer that becomes thinner in a direction from the upper surface of the insulating layer towards the bottom of the recess.

10. The method of claim 8, wherein the second barrier metal layer is formed by a PVD process.

11. The method of claim 8, wherein the forming of the damascene wiring comprises growing Al from the bottom of the recess.

12. The method of claim 8, wherein the forming of the etch stop layer pattern comprises forming a first etch stop film and subsequently forming a second etch stop film on the first etch stop film.

13. The method of claim 12, wherein the forming of the etch stop layer pattern comprises:

forming the first etch stop film and the second etch stop film to each extend over the upper surface of the insulating layer pattern as well as in the portion of the recess which is not occupied with the damascene wiring, and subsequently selectively removing respective portions of the second etch stop film, the first etch stop film, the second barrier metal layer, and the first barrier metal layer to expose the upper surface of the insulating layer pattern.

14. The method of claim 8, further comprising forming a contact hole aligned with the recess, after the etch stop layer pattern has been formed.

* * * * *